Oct. 28, 1969 G. W. McIVER ET AL 3,475,665

ELECTRODE LEAD FOR SEMICONDUCTOR ACTIVE DEVICES

Filed Aug. 3, 1966 4 Sheets-Sheet 1

Oct. 28, 1969 G. W. McIVER ETAL 3,475,665

ELECTRODE LEAD FOR SEMICONDUCTOR ACTIVE DEVICES

Filed Aug. 3, 1966 4 Sheets-Sheet 2

George W. McIver,
James L. Buie,
INVENTORS.
BY.
James H. Griffin
ATTORNEY.

George W. McIver
James L. Buie
INVENTORS

George W. McIver
James L. Buie
INVENTORS

United States Patent Office 3,475,665

Patented Oct. 28, 1969

3,475,665

ELECTRODE LEAD FOR SEMICONDUCTOR ACTIVE DEVICES

George W. McIver, El Segundo, and James L. Buie, Panorama City, Calif., assignors to TRW Inc., Redondo Beach, Calif., a corporation of Ohio Filed Aug. 3, 1966, Ser. No. 569,866
Int. Cl. H01l *11/00, 15/00*
U.S. Cl. 317—235 12 Claims

ABSTRACT OF THE DISCLOSURE

A semiconductor device wherein plural semiconductor regions are disposed in a portion of a substrate, isolated by a dielectric isolation layer from the remainder of the substrate, and all electrical leads are connected to said regions through one side of the substrate, with an electrical connection to one of said leads passing through the thickness of the substrate outside of the dielectric layer to an extended contract on the opposite side of the substrate.

Figure 3:
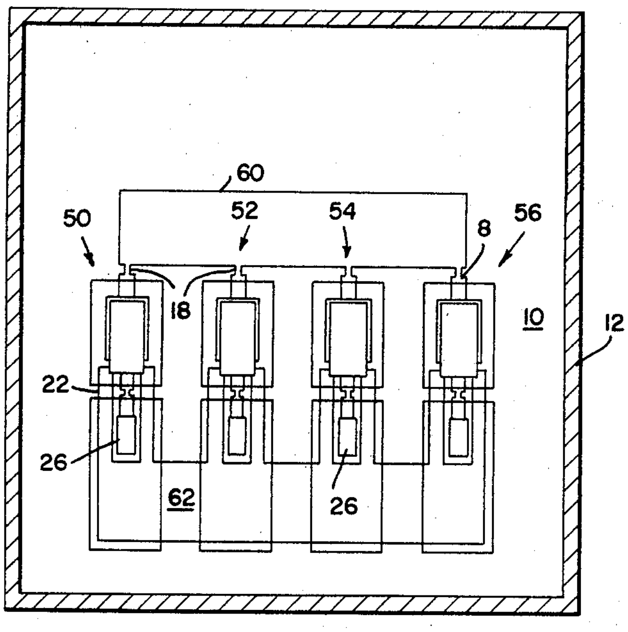

This invention relates to semiconductors, integrated circuits, and the like and more particularly to an improved electrode lead for semiconductor devices constructed for high frequency or high power applications.

The prior practice high frequency and high power semiconductor active elements (transistors, diodes, et cetera) have often serious limitations due to two phenomena. First, because charge flow and power dissipation are not uniform throughout the whole area of most semiconductor elements, a process known as "second breakdown" begins to occur at the higher power levels. This is especially true in power transistors, where many transistor areas are connected in parallel. As a device heats, performance degrades, leaving only limited areas carrying the entire load. Due to pinch effect and the negative temperature coefficient of the emitter-base potential, current flow becomes confined to very small regions, causing melting and destruction of the entire element.

The second limiting phenomenon which this invention seeks to cure is the large series inductance created by various semiconductor electrode leads as they carry high frequency current from the package terminal into the device itself. In microwave transistors, for example, the emitter leads often produce an inductance that is one of the more significant frequency-limiting parameters. Prior structures also have disadvantages in undesirable parasitics introduced by mounting.

The main object of this invention is to reduce the second breakdown and lead inductance problems described above and to allow efficient paralleling. Applicants teach both a method of construction and transistor structure principles that result in a small resistance appearing in series with any common lead, such as the common emitters mentioned above. Although in the detailed description below the inventive principles will always be discussed and illustrated in connection with an N-P-N microelectronic transistor operating in a grounded emitter configuration, because this was the first reduction to practice of the invention, the inventive principles have far broader usefulness than this one specific application and should receive patent protection accordingly. For example, a grounded base transistor, a P-N-P device, or a two-layer or four- or more-layer device would be equally improved by the concepts disclosed below.

The inventive method includes passing the emitter current through the semiconductor substrate to some conductor such as the metal container of the element. Since this produces a greatly shortened current path within the element, the inductive reactance generated by emitter current is reduced almost to insignificance. This concept will be referred to hereinafter as "substrate termination." This new electrode lead construction method also saves the manufacturing effort involved in wiring one lead of the device and the possibility of error associated therewith.

As another feature of the invention, there is provided temperature stable "cell" transistor to be constructed by practicing substrate termination in a very specific manner. This concept, referred to hereinafter as "resistance stabilization," includes the variation of the spreading resistance of the substrate traversed by current passing from a substrate-terminated electrode lead to a terminal, metal container can, mounting structure, or the like. This spreading resistance may be varied by varying the substrate composition (basic material or doping), varying the substrate thickness, or varying the area of interface through which the current passes at either end of its travel through the substrate. The result is a resistance-stabilized device with no extra manufacturing effort or bulk additions, connections, joints, et cetera involved in adding the resistance.

As a result, any number of such devices may be connected in parallel to form an array of "cell" transistors (or any other types of active elements) which serve the purpose of a large power transistor. A power transistor made in this fashion exhibits temperature stability to a degree unobtainable by conventional construction. Also, due to the fact that the cells may be specially arranged on the substrate, the thermal resistance of the array may be decreased to minimum value, thereby improving the power performance.

By proper impurity doping of the substrate, the emitter resistor can have a positive temperature coefficient. Also, by constructing the resistor in close proximity to the "cell" transistor, the emitter resistor will be sensitive to the temperature of the cell. These combined factors will compensate or partially compensate the negative temperature coefficient of the emitter-base contact potential. As a result, several transistor cells may be paralleled with more uniform current distribution to the paralleled array.

Figure 1:
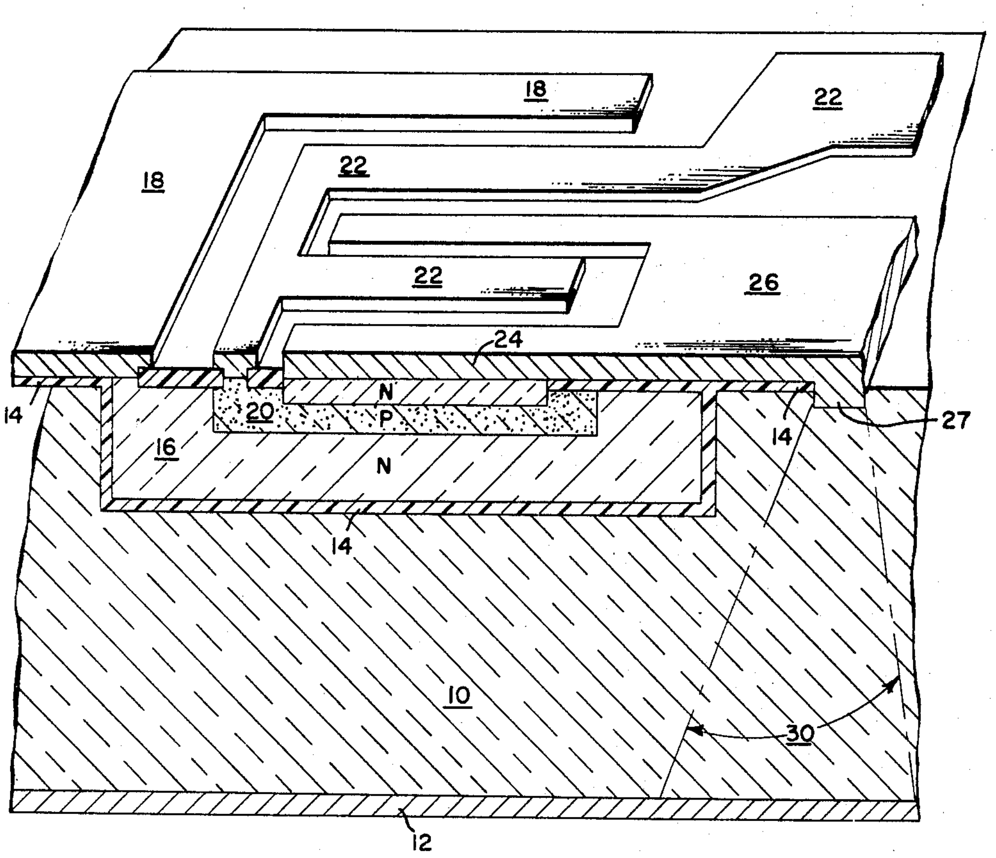
Figure 2A:
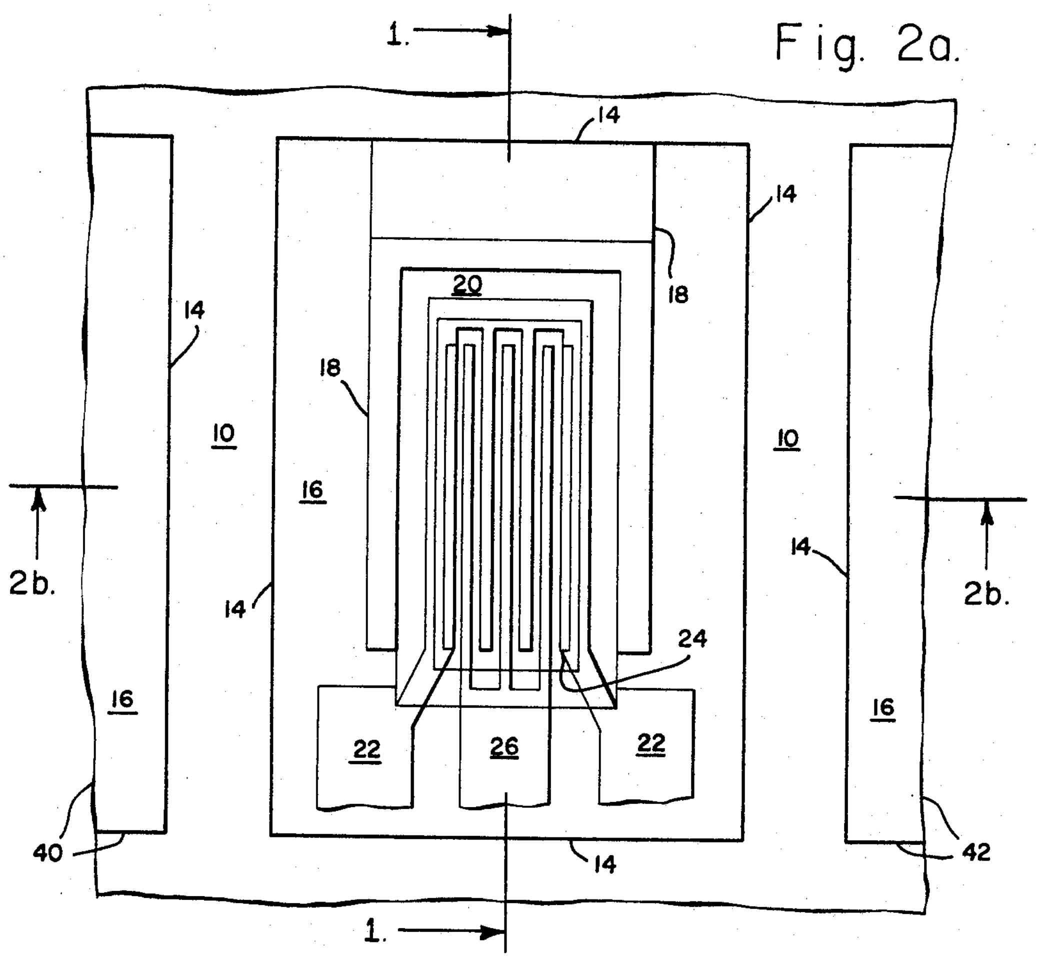
Figure 2B:
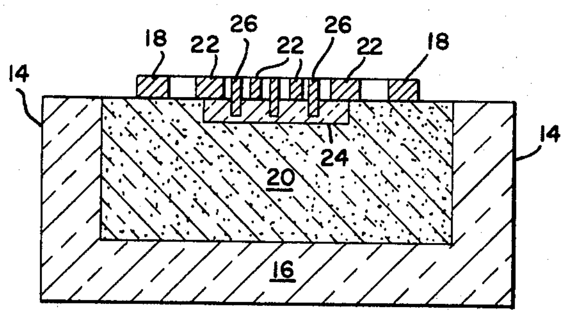

Other objects and features of the instant invention and a better understanding thereof may be had by referring to the following description and claims, taken in conjunction with the accompanying drawings which:

FIGURE 1 is a perspective view partly in cutaway of a semiconductor transistor built according to the principles of the instant invention;

FIGURE 2 presents a plan and front elevation of a semiconductor transistor built according to the principles of the instant invention; and FIGURE 3 illustrates the use of the semiconductor transistor of FIGURE 2 in a microcircuit.

Figure 4A:
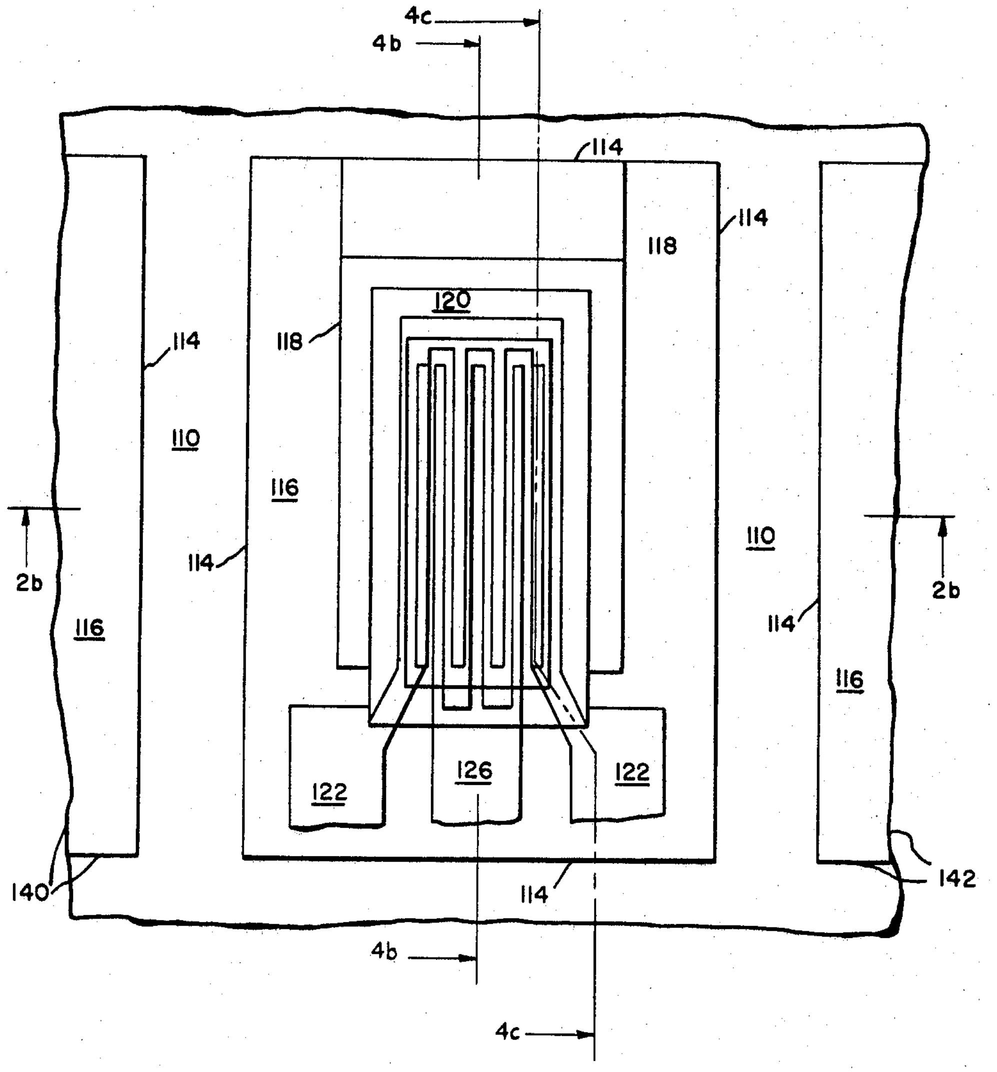

FIG. 4*a* is a plan view, similar to FIG. 2, showing an alternative embodiment in which the base electrode is connected to the substrate.

Figure 4B:
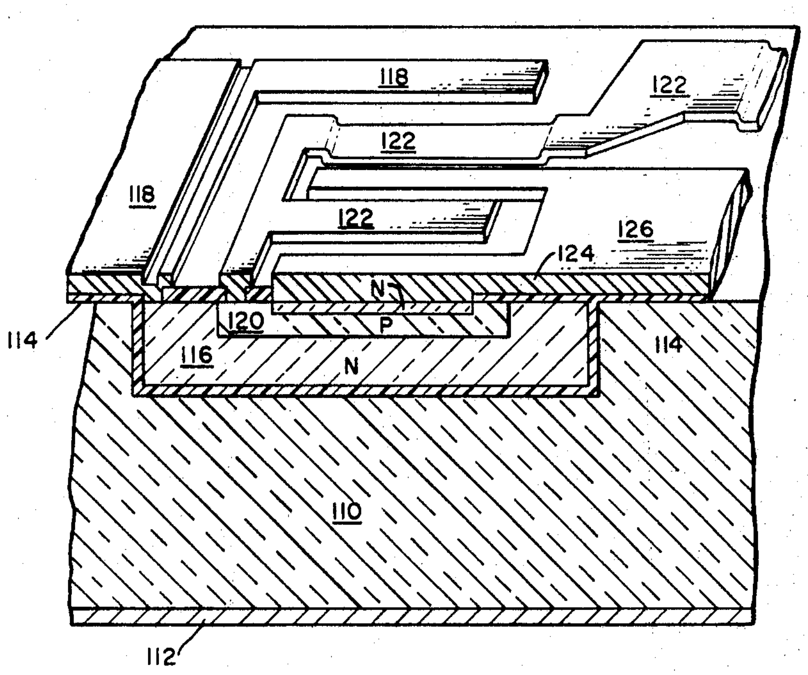
Figure 4C:
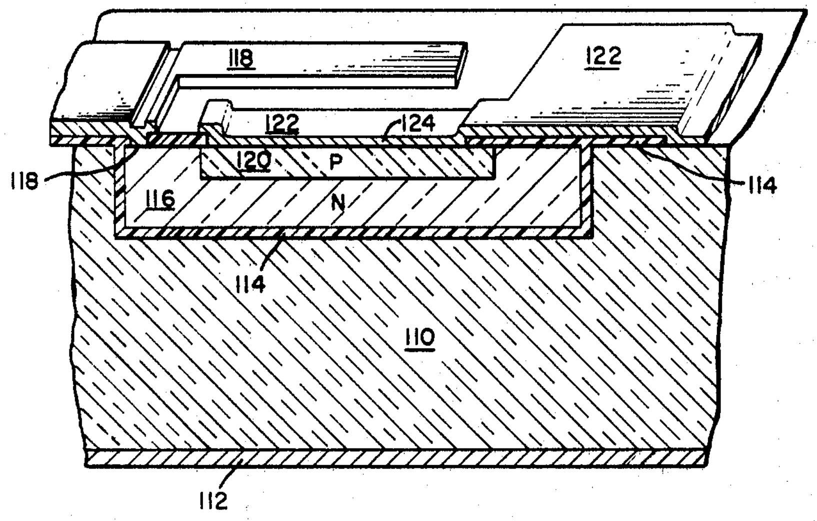

FIG. 4*b* is a perspective view, partly in section, taken along line 4*b*—4*b* of FIG. 4*a*, and similar to FIG. 1, and FIG. 4*c* is a perspective view partly in section, and taken along lines 4*c*—4*c* of FIG. 4*a*.

Referring to FIGURE 1, the transistor shown therein to illustrate the inventive principles has as its base a low-resistivity polycrystalline substrate 10. A number of layers of semiconductor and dielectric have been formed by processes of deposition and diffusion to form the various regions of the transistor. These transistor regions are isolated from the substrate 10 by a layer of dielectric 14. In actual transistors made in order to reduce the inventive principles discussed herein to practice, the polycrystalline substrate 10 was N-doped and had a resistivity of 0.05 ohm-centimeter. However, the principles of the invention extend far beyond any one type of doping or any specific resistivity of the substrate 10. The substrate 10 is surrounded by a metal can 12, which forms the outer container of the transistor of FIGURE 1.

The transistor proper is formed by any of a number of known processes. The first region of the transistor is a collector region 16, which is the output electrode of the transistor of FIGURE 1. Electrical connection of the collector 16 to the outside circuitry in which the transistor of FIGURE 1 is coupled is provided by a collector contact 18. which may be constructed of some conductive metal such as aluminum or gold.

Diffused within the collector 16 is a base region 20, which is of the opposite doping of the collector 16 and is the control electrode of the transistor of FIGURE 1. The base region 20 is connected to its outside circuitry by a lead or contact 22 also constructed of aluminum, gold, or some other metal commonly used in semiconductor technology.

Diffused within the base region 20 is an emitter region 24 which forms the ground electrode of the transistor of FIGURE 1. The emitter region 24 has an electrical contact 26 of the metals aluminum, gold, or the like, specified above for the contacts 18 and 22. Because the transistor given as a specific example in FIGURE 1 is intended to be used in the grounded emitter configuration, the principles of the instant invention deal specifically with the emitter lead 26.

In the usual practice of microelectronics or integrated circuit technology, the transistor of FIGURE 1 would be but one "cell" in a larger "transistor" of a microelectronic amplifier or the like. Due to the necessity of economical microcircuit manufacture and close packing of elements in microelectronic circuits, a number of cells of the sort shown in FIGURE 1 would be lined up very near to one another, so that it would be necessary for the collector contact 18 and the base and emitter contacts 22 and 26, respectively, to proceed straight outward to their respective circuit terminals in a direction parallel to the adjacent cells and to the contacts of the adjacent cells, to ensure that electrical connection or coupling between contacts is minimized. Because of this necessity, the emitter lead 26 creates a large parasitic inductance associated with the emitter.

Since whenever microelectronic transistors are used in the grounded emitter configuration, the contacts 26 leading to the emitters of the various cells are usually joined, it is one principle of the instant invention to cut down the length of the emitter lead 26 to its barest minimum by electrically connecting the emitter lead 26 directly to the substrate 10, as shown at 27. The nearer to the transistor that this connection is made, the shorter will be the emitter lead 26 and the less parasitic inductive reactance will be created by current through the emitter lead 26. Rather than flowing to some outside terminal, emitter lead current then passes through the polycrystalline substrate 10 to the metal can 12, which can be electrically connected to serve as circuit ground for the networks in which the transistor of FIGURE 1 is used.

As was stated above, the two performance-limiting factors in present high power-high frequency transistors are second breakdown and large input electrode inductance. It has been shown above how the shortening of the emitter lead 26 by electrical connection to the substrate 10 minimizes the parasitical inductance.

It is another feature of the invention that this connection may also eliminate the second breakdown problem as well. The principle involved is that of connecting a resistor in series between the emitter contact 26 and the ground terminal, which is in effect a metal container can 12.

According to one inventive principle, this resistor is composed of a region 30 in the polycrystalline substrate 10 running from the emitter contact 26 to the metal container can 12. The size of the region 30 is determined by the exact characteristics of the polycrystalline substrate, such as its material (usually silicon) and its exact resistance. This is because the emitter resistance used to prevent second breakdown is the spreading resistance of the emitter current between that area of the polycrystalline substrate 10 in electrical connection with the emitter contact 26 and the metal can 12. The effect of the resistor 30 in series with the emitter 24 is to prevent overload of any one cell in a large composite transistor.

It can be seen that the inventive principle of leading one of the electrical contacts, here shown as the contact 26, directly to the substrate 10 need not be confined to making transistors or other three layer devices. This concept would work equally well making diodes or making four layer and larger semiconductor active elements or metal on silicon (MOS) devices. The advantages in any case would be the same: the elimination of a long electrical lead which causes parasitic inductance whenever high frequency current is flowing therethrough; the creation with no extra manufacturing effort of a series resistor between the electrical lead and its terminal; and the elimination of one wiring operation from the transistor manufacturing and utilization process.

The resistor 30 created by this direct-contact technique is very important where a transistor of the sort shown in FIGURE 1 is to be used in one cell of a composite or parallel-array transistor. The power capability of such an array is directly proportional to the number of cells used, and the impedance of the array is lowered by a factor equal to the number of cells. However, this power capability and impedance lowering can be achieved only if all the cells in an array divide equally the current flowing through the array; yet unequal current division is very likely, due to the fact that a certain amount of positive thermal feedback occurs because the emitter-base junction of the cell has a negative temperature coefficient. The resistor 30 taught herein serves as a negative temperature feedback circuit element to minimize the above-mentioned temperature-dependent characteristics.

FIGURE 2 shows in plan view and front elevation the exact design and study of a transistor cell as pictured in perspective in FIGURE 1, as it appears in an array of cells used to form one high-power high-frequency transistor. In FIGURE 2(*a*), the proximity of the adjacent cells is shown by placing a portion of cells 40 and 42 in the position they would take in an array. Each rectangle, numbered 16, represents the collector region of one cell or individual transistor. The cross hatched areas 18, 22, and 26, are the metallic contacts discussed above for the collector, base, and emitter, respectively, of the cell. The emitter 24 and base 20 of the transistor are also shown.

The reason more than one strip of material is used by the contacts 22 and 26 to make electrical connection with the base and emitter, respectively, is to maximize the number of active, carrier-transporting areas in the semiconductor region 20 and 24. Moreover, the greater the ratio of width of metal contact strips to length, the less will be the parasitic inductance created by the passage of the high-frequency current signal through the leads 18, 22, and 26. For example, if one wire were used in place of the leads 18, 22, and 26, at the frequency for which the transistor of FIGURE 1 was designed—about 2.25 gHz.—the wire would have inductive reactance of approximately 9.6Ω, which would make the transistor unusable. On the other hand, the transistor shown in FIGURES 1 and 2 would have an inductive reactance at 2.2 gHz. of about 1Ω. This value is not a serious limitation on transistor use in various circuit designs. This low inductive reactance is obtained by terminating the emitter lead 26 to the substrate 10, which is at electrical ground. Therefore, by terminating the emitter lead 26 with an electrical connection into the substrate 10 immediately after clearing the collector region (bounded by the dielectric 14) emitter inductive reactance can be cut down to the 1Ω value mentioned above and, in addition, the spreading resistance 30 of the substrate 10 can be used as an emitter stabilizing resistor.

FIGURE 3 is a plan view of an array-transistor containing four cell transistors of the sort discussed above. These four transistors numbered 50, 52, 54, and 56 are placed upon one substrate 10 contained within a metal can 12, preferably by the dielectric isolution method set forth in U.S. patent application Ser. No. 355,605—Dielectric Isolation for Monolithic Circuit, filed in the name of James Lang Buie on Mar. 30, 1964. In the array type of transistor, of course, the collector leads 18 are joined together by one large conducting area 60 and, similarly, the base leads 22 are joined together by one large conducting area 62.

The emitter leads 26 are electrically connected to the substrate 10 just as near to the transistors 50–56 as is conveniently possible. It can be seen that if it were necessary to electrically connect the emitter lead 26 to a common conducting strip similar to the collector strip 60 and the base strip 62, it would be necessary to add another deposition step to the manufacturing process of the transistor; in fact, because the conductors 18, 22, and 26 cannot be electrically connected to one another, it would be necessary to add two steps: one step to deposit insulating material on the first conducting strip laid down and a second step to lay down the second conductive strip over the first. Thus, another advantage of the invention is that it permits the base lead 22 and the emitter lead 26 to be fitted within one another without adding two more steps to the manufacturing process of the transistor. In the prior practice it was usually found necessary to run all the leads 22 and 26 outward to the edge of the substrate 10, where they ended in terminals that were interconnected and wired to the outside circuitry. This would result in a parasitic inductance in the emitter lead 26 that would make an array such as that shown in FIGURE 3 prohibitive at the gHz. frequencies achieved by the transistor of FIGURE 1.

Thus, applicant has achieved an improved method of semiconductor device fabrication whereby one region of such a device may be directly connected to the dielectrically isolated substrate in which the device resides. This inventive method not only minimizes the parasitic inductance associated with long electrode leads in microcircuits, but also simplifies the manufacture of the circuit and automatically provides a resistance in series with the electrode so connected. The provision of such a resistor has a great advantage in eliminating the second breakdown and shorting problem associated with high-frequency, high-power microcircuits.

FIGS. 4*a*, 4*b*, and 4*c* illustrate an alternative embodiment in which the base electrode is connected through the substrate 110 to the metal container 112, instead of the emiter electrode as in FIGS. 1, 2, and 3. The numbering of the elements in this alternative embodiment bear the same last two digits as in FIGS. 1, 2, and 3 but preceded by the number 100, that is; the metal can is numbered 112, the substrate is numbered 110, the dielectric layer is numbered 114, the diffused collector region is numbered 116, the collector contact is numbered 118, the diffused base is numbered 120, the base contact is numbered 122, and the emitter contact is numbered 126.

As best shown in FIG. 4*c*, the base contact 122 is extended beyond the dielectric 114 and makes electrical contact with the substrate 110. This electrical connection permits base current to pass through the substrate 110 to the metal can 112 which can be electrically connected to serve as circuit ground for the network in the same manner as in the embodiment of FIGS. 1, 2, and 3 but in a different circuit configuration. Again as in the earlier embodiment, a resistor region (not shown) may be provided in the substrate in series between the base contact and the ground terminal 112 in the same manner as previously described.

Although this invention has been described in its preferred form with a certain degree of particularity it should be understood that the present disclosure of the preferred form has been made only by way of example and that numerious changes in the details of the construction and in the combination and arrangement of parts may be resorted to without departing from the spirit and the scope of the invention as hereinafter claimed. Especially, the electrode or semiconductor region upon which the substrate termination and resistance stabilization principles are practiced may be the emitter, base, or conceivably any other region of a diode, transistor, MOS, or multi-layer device.

We claim:

1. A semiconductor device, including:
- a substrate;
- a plurality of semiconductor regions in said substrate and occupying a portion of the thickness through said substrate;
- each region having a portion disposed adjacent the same side of the substrate;
- a dielectric isolation layer having base and side portions within the substrate forming an internal dielectric enclosure about the regions and confining the enclosed regions to a portion of the transverse thickness through the substrate;
- an electrical lead for each region disposed on said one side of the substrate;
- a first end of each of said electrical leads being electrically connected to a respective one of each of said semiconductor regions;
- a second end of a first one of said leads being electrically connected to said substrate at a position beyond the sides of said dielectric isolation layer a region of material of lower electrical resistance than said substrate provided traversely through said substrate at said position, and said second end of a first one of said leads and said region providing electrical connection transversely through the thickness of said substrate to the opposite side of the substrate,
- and an electrical contact connected to the opposite side of the substrate.

2. The semiconductor device of claim 1 wherein said substrate rests in a container and said container is adapted to serve as an electrical terminal of said semiconductor active element.

3. The semiconductor device of claim 1 wherein the second end of said first lead is electrically connected to said substrate across a certain area of electrical contact and said area of electrical contact and the thickness and composition of said substrate cooperate to provide a certain resistance in series with said first lead.

4. The semiconductor device of claim 3 wherein said substrate rests in a container and said container is adapted to serve as an electrical terminal of said semiconductor device, and the distance from the second end of said first lead is such as to provide a certain resistance in series with said first lead.

5. The semiconductor device of claim 1 with the additional specification that:
- said plurality of regions includes an emitter, a base, and a collector;
- each said region has one of said electrical leads connected thereto; and
- the electrical lead connected to the emitter is terminated in the substrate.

6. In the semiconductor device of claim 1, an additional plurality of semiconductor regions in said substrate disposed at a position longitudinally spaced from the first mentioned regions and beyond the isolation layer, said additional regions having portions adjacent the same side of the substrate,
- an electrical lead for each of said additional regions disposed on said side of the substrate, with one end of each of said latter leads electrically connected to a respective different one of said additional regions, and a second end of one of said latter leads electrically connected to said substrate and providing electrical connection transversely through the thickness of said substrate.

7. The semiconductor device of claim 5 wherein the second end of the emitter lead is electrically connected to said substrate across a certain area of electrical contact and said area of electrical contact and the thickness and composition of said substrate cooperate to provide a certain resistance in series with said emitter lead.

8. The semiconductor device of claim 7 wherein said substrate rests in a container and said container is adapted to serve as an electrical terminal of said semiconductor device, and the distance through the substrate from the second end of the emitter lead to the container is such as to provide a certain resistance in series with said lead.

9. The semiconductor device of claim 1 with the additional specification that:

said plurality of regions includes an emitter, a base and a collector;

each said region has one of said electrical leads connected thereto; and the electrical lead connected to the base is terminated in the substrate.

10. The semiconductor device of claim 9 wherein said substrate rests in a container and said container is adapted to serve as an electrical terminal of said semiconductor device.

11. The semiconductor device of claim 9 wherein the second end of the base lead is electrically connected to said substrate across a certain area of electrical contact and said area of electrical contact and the thickness and composition of said substrate cooperate to provide a certain resistance in series with said base lead.

12. The semiconductor device of claim 11 wherein said substrate rests in a container and said container is adapted to serve as an electrical terminal of said semiconductor device, and the distance through the substrate from the second end of the base lead to the container is such as to provide a certain resistance in series with said lead.

References Cited

UNITED STATES PATENTS

| | | |
|---|---|---|
| 3,025,437 | 3/1962 | Namen et al. |
| 3,150,299 | 9/1964 | Noyce. |
| 3,199,001 | 8/1965 | Dyben. |
| 3,244,950 | 4/1966 | Ferguson. |
| 3,256,465 | 6/1966 | Weissenstern et al. |

OTHER REFERENCES

IBM Tech Bulletin, "Fabrication of Two-Surface Devices" by Regh, vol. 9, No. 2, July 1966, pages 195–196.

JOHN W. HUCKERT, Primary Examiner

J. D. CRAIG, Assistant Examiner

U.S. Cl. X.R.

307—304